(12) United States Patent
Oh et al.

(10) Patent No.: US 8,120,971 B2
(45) Date of Patent: Feb. 21, 2012

(54) INTERNAL SOURCE VOLTAGE GENERATING CIRCUIT OF SEMICONDUCTOR MEMORY DEVICE

(75) Inventors: Ki-Seok Oh, Uiwang-si (KR); Young-Sun Min, Seoul (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 205 days.

(21) Appl. No.: 12/581,186

(22) Filed: Oct. 19, 2009

(65) Prior Publication Data

US 2010/0097867 A1 Apr. 22, 2010

(30) Foreign Application Priority Data

Oct. 22, 2008 (KR) .................. 10-2008-0103833

(51) Int. Cl.
*G11C 7/06* (2006.01)

(52) U.S. Cl. .............. 365/189.07; 365/189.08; 365/222; 327/530; 323/313; 323/316

(58) Field of Classification Search ............ 365/189.07, 365/189.08, 222; 327/530; 323/313, 316
See application file for complete search history.

(56) References Cited

U.S. PATENT DOCUMENTS

| | | | | |
|---|---|---|---|---|
| 5,744,998 A * | 4/1998 | Ito et al. | | 327/537 |
| 5,770,964 A * | 6/1998 | Suma | | 327/328 |
| 5,877,985 A * | 3/1999 | Banba et al. | | 365/185.21 |
| 5,982,162 A * | 11/1999 | Yamauchi | | 323/316 |
| 6,031,397 A * | 2/2000 | Banba | | 327/81 |
| 6,046,624 A * | 4/2000 | Nam et al. | | 327/530 |
| 6,281,745 B1 * | 8/2001 | Kim et al. | | 327/541 |
| 6,333,668 B1 * | 12/2001 | Takashima | | 327/538 |
| 6,333,669 B1 * | 12/2001 | Kobayashi et al. | | 327/541 |
| 6,480,053 B1 * | 11/2002 | Teramoto | | 327/408 |
| 6,515,461 B2 * | 2/2003 | Akiyama et al. | | 323/313 |
| 6,611,472 B2 * | 8/2003 | Kitamoto et al. | | 365/227 |
| 6,798,276 B2 * | 9/2004 | Mori et al. | | 327/541 |
| 6,870,790 B2 * | 3/2005 | Horiguchi et al. | | 365/233.15 |
| 6,990,031 B2 * | 1/2006 | Hashimoto et al. | | 365/222 |
| 7,072,238 B2 * | 7/2006 | Chae et al. | | 365/226 |
| 7,139,208 B2 * | 11/2006 | Arimoto et al. | | 365/222 |
| 7,834,680 B2 * | 11/2010 | Kim | | 327/536 |

FOREIGN PATENT DOCUMENTS

| | | |
|---|---|---|
| JP | 2001-006357 | 1/2001 |
| KR | 1998-0011409 | 4/1998 |
| KR | 100432973 B1 | 5/2004 |

* cited by examiner

*Primary Examiner* — Viet Q Nguyen
(74) *Attorney, Agent, or Firm* — Volentine & Whitt, PLLC

(57) ABSTRACT

An internal source voltage generating circuit includes a comparison voltage generator which receives reference and internal source voltages, outputs to a second node a comparison voltage differentially amplified responsive to a voltage of a first node according to a difference between the reference and internal source voltages, and allows a driving current to flow from a third node to a fourth node. An internal voltage driver transfers an external source voltage to an output node responsive to the comparison voltage. A driving current generator increases the driving current flowing from the third node to the fourth node responsive to the voltage of the first node which rises when the internal source voltage abruptly drops. The internal source voltage generating circuit is insensitive to variation of an external source voltage, exhibits improved response time when an internal source voltage abruptly drops, and stably generates an internal source voltage.

13 Claims, 3 Drawing Sheets

INTERNAL SOURCE VOLTAGE GENERATING CIRCUIT OF SEMICONDUCTOR MEMORY DEVICE

CROSS-REFERENCE TO RELATED APPLICATIONS

A claim of priority under 35 U.S.C. §119 is made to Korean Patent Application No. 10-2008-0103833, filed on Oct. 22, 2008, the entirety of which is hereby incorporated herein by reference.

BACKGROUND

The inventive concepts described herein are generally related to an internal source voltage generating circuit of a semiconductor memory device, and more particularly to an internal source voltage generating circuit of a semiconductor memory device in which a malfunction is prevented by rapidly restoring a stable internal source voltage when a voltage of an internal source voltage node abruptly drops due to operation of internal circuits.

In general, semiconductor memory devices require a low internal operation voltage. Accordingly, such semiconductor memory devices typically convert a high external voltage into a low internal voltage, and the low internal voltage is used as the internal operation voltage of the device. Semiconductor memory devices operate reliably when the internal source voltage generated from an external source voltage VDD stabilizes a predetermined time after the external source voltage is applied. Since the internal source voltage is used as a source voltage for main internal circuits which affect the performance of semiconductor memory devices, such as peripheral logic circuits or memory cell arrays, a stable constant voltage source is thus a necessity.

In particular, semiconductor memory devices employed in portable electronics include both a standby internal source voltage generating circuit which always operates when an external source voltage is applied, and an active internal source voltage generating circuit which operates only during an active mode.

Since current consumption is high in the active mode, the active internal source voltage generating circuit must have a large current driving ability and high response speed. Since current consumption is low in the standby mode, the standby internal source voltage generating circuit has a small current driving ability and slow response speed.

SUMMARY

Exemplary embodiments of the inventive concept are generally related to providing a stable internal source voltage generating circuit of a semiconductor memory device, in which an internal source voltage which abruptly drops during internal operation of the semiconductor memory device is raised to a normal voltage regardless of variation of an external source voltage, and a response time taken to raise the internal source voltage to the normal voltage is efficiently reduced.

In example embodiments of the inventive concept, an internal source voltage generating circuit of a semiconductor memory device is provided including a comparison voltage generator which receives a reference voltage and an internal source voltage, outputs to a second node a comparison voltage which is differentially amplified in response to a voltage of a first node determined according to a difference between the reference voltage and the internal source voltage, and allows a driving current to flow from a third node to a fourth node; an internal voltage driver which transfers an external source voltage to an output node in response to the differentially amplified comparison voltage and outputs the internal source voltage; and a driving current generator which increases the driving current flowing from the third node to the fourth node in response to the voltage of the first node which rises when the internal source voltage abruptly drops.

In example embodiments of the inventive concept, the comparison voltage generator may include a first PMOS transistor and a first NMOS transistor which are serially connected between the external source voltage and the third node, and which have gates connected to the first node and the reference voltage, respectively; a second PMOS transistor and a second NMOS transistor which are serially connected between the external source voltage and the third node, and which have gates connected to the first node and the internal source voltage, respectively; and a third NMOS transistor which is connected between the third node and the fourth node, and which has a gate connected to the reference voltage, wherein a contact point between the second PMOS transistor and the second NMOS transistor is connected to the first node.

In example embodiments of the inventive concept, the internal voltage driver may include a third PMOS transistor which is connected to the external source voltage at one side and transfers the external source voltage to the output node at an other side thereof, in response to the differentially amplified comparison voltage applied to a gate of the third PMOS transistor.

In example embodiments of the inventive concept, the driving current generator may include a fourth NMOS transistor which has one side connected to the third node and an other side connected to the fourth node which is grounded, and which generates the driving current in response to the voltage of the first node applied to a gate of the fourth NMOS transistor.

In example embodiments of the inventive concept, in the comparison voltage generator, when the second NMOS transistor is turned on weakly due to an abrupt drop of the internal source voltage at the output node so that the voltage of the first node rises, the first PMOS transistor may be turned on weakly so that the comparison voltage at the second node drops.

In example embodiments of the inventive concept, the internal voltage driver may be turned on strongly in response to a drop of the comparison voltage at the second node, so that the internal source voltage at the output node rises and the internal source voltage that is abruptly dropped is restored to a normal voltage.

In example embodiments of the inventive concept, the driving current generator may restore the internal source voltage to a normal voltage by increasing the driving current using the voltage of the first node which is automatically raised, without separately detecting voltages of internal circuits connected to the output node.

In example embodiments of the inventive concept, when an abrupt voltage drop occurs in a high-temperature environment, the fourth NMOS transistor may be turned on strongly in response to the voltage of the first node which is automatically raised, so that the driving current flowing from the third node to the fourth node may be increased, the voltage of the first node may drop so that the third PMOS transistor may be turned on strongly, and the internal source voltage at the output node may be raised so that a normal voltage may be rapidly restored.

In example embodiments of the inventive concept, immediately before an abrupt voltage drop occurs, a threshold voltage of the second PMOS transistor may be raised so that the second PMOS transistor may be turned on weakly and the voltage of the third node may be decreased, and the fourth NMOS transistor may be turned on weakly so that current expended in the driving current generator may be reduced.

In example embodiments of the inventive concept, a voltage between a gate and a source of the third NMOS transistor may become constant in response to the reference voltage applied to the gate of the third NMOS transistor, so that a current driving ability may be fixed regardless of variation of the external source voltage.

BRIEF DESCRIPTION OF THE DRAWINGS

The accompanying drawings are included to provide a further understanding of the embodiments of the inventive concept. It should be understood that various aspects of the drawings may be exaggerated for clarity, wherein.

DETAILED DESCRIPTION OF THE EMBODIMENTS

Figure 1:
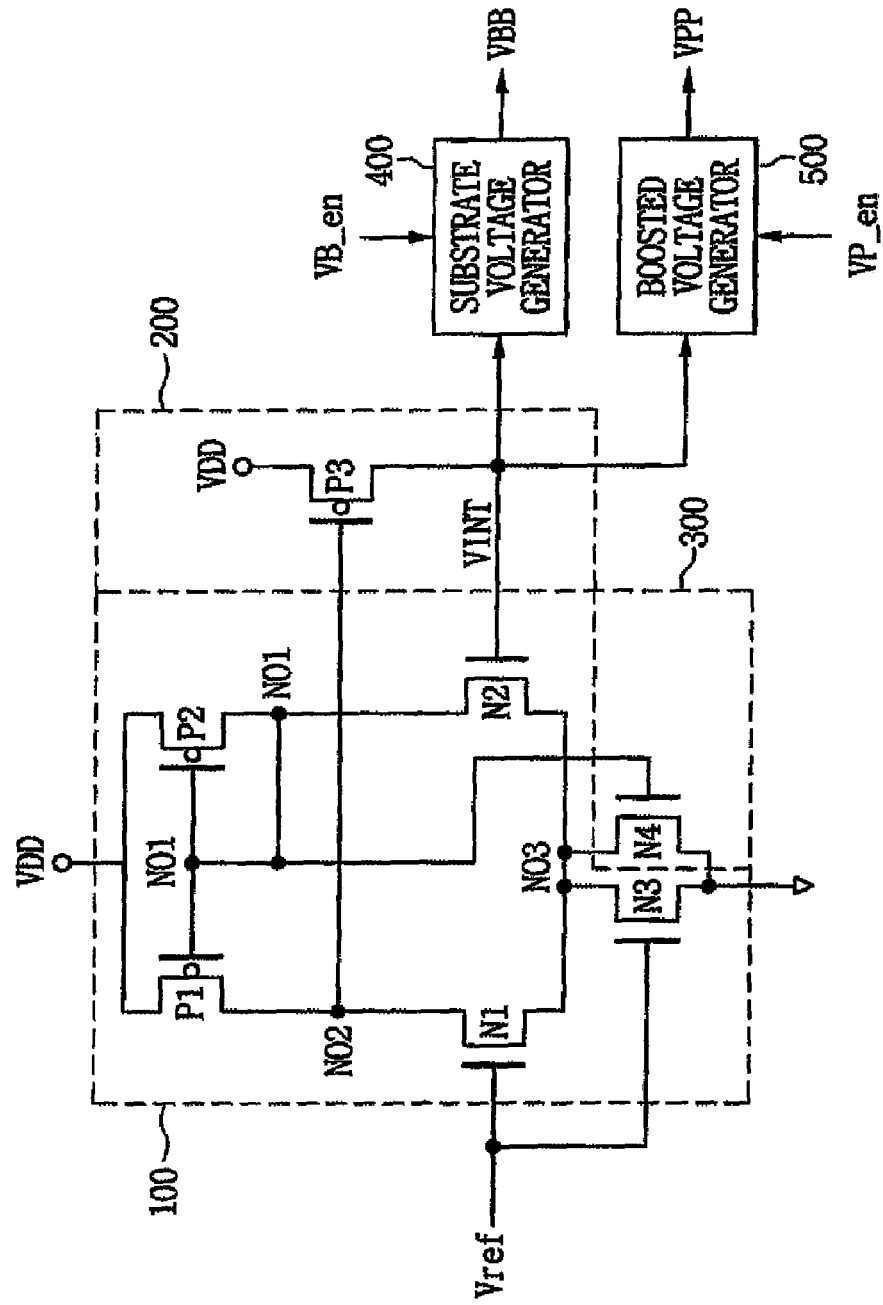
FIG. 1 is a block diagram of an internal source voltage generating circuit and peripheral circuits of a semiconductor memory device according to an example embodiment of the inventive concept.

Various example embodiments will now be described more fully with reference to the accompanying drawings in which some example embodiments are shown. Although detailed illustrative embodiments are disclosed herein, specific structural and functional details as disclosed are merely representative for purposes of describing example embodiments. The inventive concept may however be embodied in many alternate forms, and should not be construed as limited only to the example embodiments set forth herein. It should be understood that the example embodiments are to cover all modifications, equivalents, and alternatives falling within the scope of the inventive concept. Like numbers refer to like elements throughout the description of the figures.

It should be understood that, although the terms first, second, etc. may be used herein to describe various elements, these elements should not be limited by these terms. These terms are only used to distinguish one element from another. For example, a first element could be termed a second element, and similarly a second element could be termed a first element, without departing from the scope of example embodiments. As used herein, the term "and/or" includes any and all combinations of one or more of the associated listed items.

It should be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It should be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof. Spatially relative terms, such as "beneath," "below," "lower," "above," "upper" and the like, may be used herein for ease of description to describe one element or a relationship between a feature and another element or feature as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, for example, the term "below" can encompass both an orientation which is above as well as below. The device may be otherwise oriented (rotated 90 degrees or viewed or referenced at other orientations) and the spatially relative descriptors used herein should be interpreted accordingly.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

FIG. 1 is a block diagram of an internal source voltage generating circuit and peripheral circuits of a semiconductor memory device according to an example embodiment of the inventive concept. The semiconductor memory device of FIG. 1 includes a comparison voltage generator 100, an internal voltage driver 200, a driving current generator 300, a substrate voltage generator 400, and a boosted voltage generator 500. The comparison voltage generator 100 comprises two PMOS transistors P1 and P2 and three NMOS transistors N1, N2 and N3, the internal voltage driver 200 includes a PMOS transistor P3, and the driving current generator 300 includes an NMOS transistor N4.

In the comparison voltage generator 100, the PMOS transistor P1 and the NMOS transistor N1 are connected in series, the PMOS transistor P2 and the NMOS transistor N2 are connected in series, and the serially connected PMOS transistor P1 and NMOS transistor N1 are connected in parallel with the serially connected PMOS transistor P2 and NMOS transistor N2. An external source voltage VDD is applied to sources of the PMOS transistors P1 and P2, and a ground voltage is connected to sources of the NMOS transistors N1 and N2 through the NMOS transistor N3.

A reference voltage Vref is applied to gates of the NMOS transistors N1 and N3 in the comparison voltage generator 100, and an internal source voltage VINT is applied to a gate of the NMOS transistor N2. Gates of the PMOS transistors P1 and P2 are connected with each other, and to a contact point between the PMOS transistor P2 and the NMOS transistor N2. A gate of the NMOS transistor N4 in the driving current generator 300 is connected to the contact point between the PMOS transistor P2 and the NMOS transistor N2.

Functions of the blocks will now be described with reference to FIG. 1. The comparison voltage generator 100 is enabled in response to a reference voltage, and receives a reference voltage Vref and an internal source voltage VINT when a driving current flows from a third node NO3 to a grounding node (fourth node). The comparison voltage generator 100 outputs a comparison voltage to a second node NO2. The comparison voltage is differentially amplified in response to a voltage of a first node N01, and is determined according to a difference between the reference voltage Vref and the internal source voltage VINT.

The internal voltage driver 200 receives an external source voltage VDD through a source and transfers the external source voltage VDD to an internal source voltage VINT output terminal which is a drain of PMOS transistor P3, in response to the differentially amplified comparison voltage applied to the gate of PMOS transistor P3.

The driving current generator 300 generates a driving current which is synchronized from the comparison voltage generator 100 in response to a voltage of the first node NO1, and which is automatically raised when an internal source voltage abruptly drops.

The substrate voltage generator 400 receives the internal source voltage VINT, and generates a substrate voltage VBB in response to a substrate voltage enable signal VB_en, and in the process detects whether or not a predetermined substrate voltage has been reached, and pumps charge until a target substrate voltage has been reached to thus generate substrate voltage VBB.

The boosted voltage generator 500 receives the internal source voltage VINT, and pumps charge in response to a boosted voltage enable signal VP_en until it reaches a predetermined target voltage to generate a boosted voltage VPP.

FIGS. 2A and 2B are simulation graphs showing the occurrence of a power dip in an internal source voltage generating circuit of a semiconductor memory device according to an example embodiment of the inventive concept. The graph of FIG. 2A shows current consumption of internal circuits over time, and the graph of FIG. 2B shows variation of an internal source voltage VINT over time.

If current consumption of internal circuits is initially 1 mA and rises to 20 mA at time t1 as shown in the graph of FIG. 2A, the internal source voltage VINT is initially 1.5V, which is the reference voltage Vref, and abruptly drops to 1.4V at time t1 as shown in the graph of FIG. 2B.

However, if the internal source voltage generating circuit of the semiconductor memory device according to the example embodiment operates at time t2, the internal source voltage VINT is abruptly raised to 1.57V, then oscillates and stabilizes at 1.5V, the reference voltage Vref, at time t3.

Figure 2:
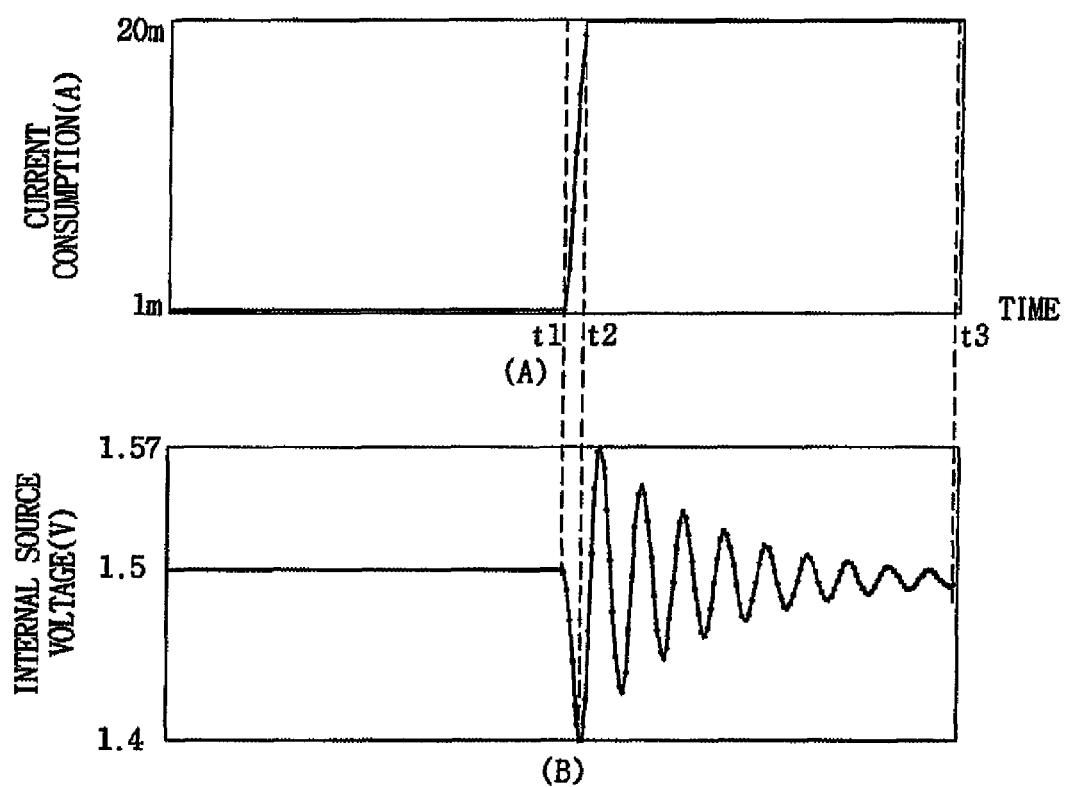
FIGS. 2A and 2B are simulation graphs showing the occurrence of a power dip in an internal source voltage generating circuit of a semiconductor memory device according to an example embodiment of the inventive concept.

Operation of the internal source voltage generating circuit of the semiconductor memory device according to the example embodiment will be described below with reference to FIGS. 1 and 2. First, when the semiconductor memory device does not perform an operation, internal circuits connected to the internal source voltage generating circuit do not use an internal source voltage VINT, and thus an internal source voltage VINT of the internal source voltage generating circuit does not change. Therefore, the comparison voltage generating circuit 100 generates the same comparison voltage as previously generated, and the internal voltage driver 200 generates the internal source voltage VINT as previously generated using the comparison voltage.

On the contrary, when the substrate voltage generator 400 and the boosted voltage generator 500, which are internal circuits connected to the internal source voltage generating circuit, operate using the internal source voltage VINT of the internal source voltage generating circuit, the internal source voltage VINT abruptly drops due to power consumption of the internal circuits.

When the internal source voltage drop occurs, an internal source voltage generating circuit operates to restore the internal source voltage. At this time, the comparison voltage generator 100 is enabled in response to a reference voltage, receives the reference voltage Vref and the internal source voltage VINT which is enhanced when a driving current flows from the third node NO3 to the grounding node, and performs differential amplification according to the difference between the reference voltage Vref and the internal source voltage VINT to output a comparison voltage.

The internal voltage driver 200 receives the external source voltage VDD through the source and increases the amount of current flowing through a source-drain channel in response to the differentially amplified comparison voltage applied to the gate. Therefore, the internal source voltage VINT rises due to the increased amount of current, so that the internal source voltage VINT which abruptly drops is restored.

That is, a reference voltage node and an internal source voltage node try to maintain the same voltage due to an operation characteristic of a differential amplifier of the comparison voltage generator. The reference voltage node maintains a constant reference voltage Vref, and the internal source voltage node is connected to respective components of the semiconductor memory device and supplies an internal source voltage VINT.

When the semiconductor memory device operates, the substrate voltage generator 400 and the boosted voltage generator 500, which are internal circuits connected to the internal source voltage node, operate, and thus current consumption of the internal source voltage node abruptly increases. Therefore, a power dip in which the voltage of the internal source voltage node abruptly drops compared to the reference voltage node occurs.

The shorter a voltage restoration time taken until the internal source voltage generating circuit operates and maintains a stable internal source voltage, the more effective the internal source voltage generating circuit. That is, in an actual configuration, when many internal circuits operate simultaneously, an internal source voltage temporarily drops, and the dropped internal source voltage has to be restored to a normal level as soon as possible in order to prevent malfunction of the semiconductor memory device.

In particular, a power dip can occur when demand for the internal source voltage becomes congested when an address signal for designating a memory cell changes in a high-integration semiconductor memory device, or when a large volume of data is simultaneously processed in a semiconductor memory device.

The NMOS transistor N2 is turned on weakly due to the abruptly dropped voltage of the internal source voltage node, and thus a synchronous current flowing from the first node NO1 to the third node NO3 is reduced, and the voltage of the first node NO1 is automatically raised. When the voltage of the first node NO1 rises, the PMOS transistor P1 which receives a voltage of the first node NO1 through the gate is turned on weakly, and thus the voltage of the second node NO2 drops.

The PMOS transistor P3, which is the internal source voltage driver 200, receives the voltage of the second node NO2 through the gate and is turned on strongly so that the voltage of the internal source voltage node rises from the power dip back to its normal voltage. At this time, the driving current generator 300 increases the driving current flowing from the third node NO3 to the grounding node in response to the raised voltage of the first node NO1.

As described above, the internal source voltage generating circuit of the semiconductor memory device according to the example embodiment restores the internal source voltage VINT by increasing the driving current using the automatically raised voltage of the first node NO1, without separately detecting voltages of peripheral circuits connected to the internal source voltage node, when the voltage of the internal source voltage node drops in the standby state.

Therefore, the substrate voltage generator 400 and the boosted voltage generator 500 connected to the internal source voltage node receive the internal source voltage VINT which is restored to normal after a power dip and pump charge until the internal source voltage VINT reaches a predetermined target voltage to generate a boosted voltage VPP and a substrate voltage VBB.

A response characteristic when a power dip occurs in an internal source voltage generating circuit of a semiconductor memory device according to an example embodiment will be described below with reference to FIGS. 1 to 2.

The NMOS transistor N4 in the driving current generator 300 generates a driving current of the comparison voltage generator 100 in response to a voltage of the first node NO1. Therefore, the driving current is obtained by adding a current of a drain-source channel of the NMOS transistor N3 of the comparison voltage generator 100 and a current of a drain-source channel of the NMOS transistor N4 of the driving current generator 300.

Here, the driving current serves to adjust a response characteristic of the comparison voltage generator 100, that is, a time over which an internal source voltage node in which a power dip has occurred is restored to its normal voltage. The greater the driving current, the more a characteristic of the comparison voltage generator 100 is improved, while the smaller the driving current, the more the characteristic of the comparison voltage generator 100 deteriorates.

Therefore, a driving current of the driving current generator 300 is increased by a current of the drain-source channel of the NMOS transistor N4 compared to when only a driving current of the comparison voltage generator 100 is generated through the NMOS transistor N3. Thus, a response characteristic of the internal source voltage generating circuit is improved, and the internal source voltage generating circuit can restore the internal source voltage VINT more rapidly.

That is, when a voltage of an internal source voltage node is lowered, the NMOS transistor N4 can be turned on strongly using a voltage of the first node NO1 which is automatically raised so that driving current flowing from the second node NO2 to a grounding node is increased. A voltage of the second node NO2 drops, and the PMOS transistor P3, which is the internal voltage driver 200, is turned on strongly so that the voltage of the internal source voltage node rises and a response characteristic for restoring a normal voltage is improved.

Figure 3:
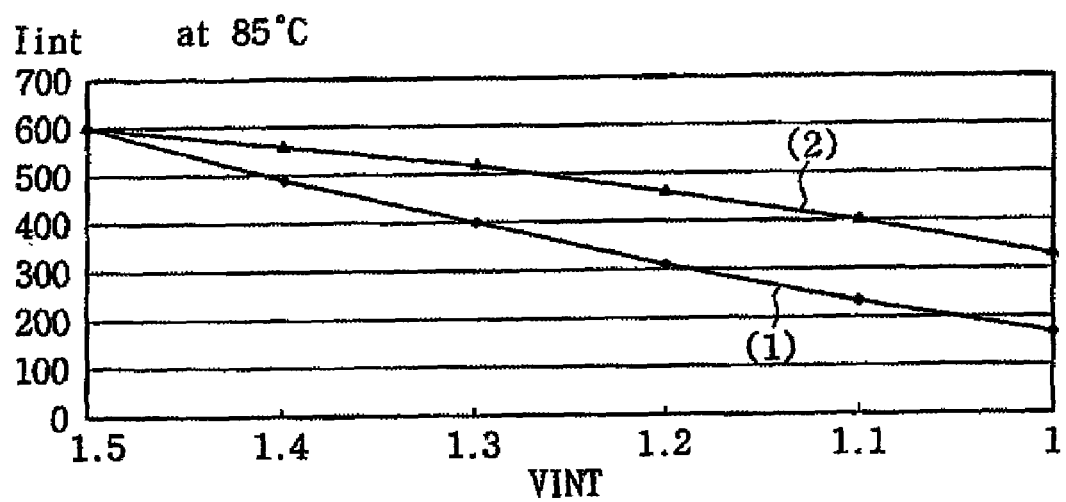
FIG. 3 is a simulation graph illustrating a response characteristic when a power dip occurs, in a high-temperature environment, in an internal source voltage generating circuit of a semiconductor memory device according to an example embodiment of the inventive concept.

FIG. 3 is a simulation graph illustrating a response characteristic when a power dip occurs, in a high-temperature environment, in an internal source voltage generating circuit of a semiconductor memory device according to an example embodiment. In FIG. 3, a curve (1) represents current variation of an internal source voltage node according to variation of an internal source voltage VINT of a conventional circuit, and a curve (2) represents current variation of an internal source voltage node according to variation of an internal source voltage VINT of the example embodiment.

When an internal source voltage VINT is initially 1.5V, which is a reference voltage Vref, and then drops to 1.0V, a current of an internal source voltage node of a conventional circuit is reduced from 600 μA to 180 μA, so that an internal source which has to be restored to a normal current level is 420 μA as can be seen in curve (1). On the other hand, the current of the internal source voltage node of the circuit shown in FIG. 1 is reduced from 600 μA to 320 μA, so that the internal source current which has to be restored to a normal current level is 280 μA as can be seen in curve (2).

Therefore, according to the internal source voltage generating circuit of the example embodiment, as shown in FIG. 3, the internal source current which has to be restored to a normal current level at the internal source voltage node is reduced compared to the conventional circuit, and the driving current generated in the driving current generator 300 is increased compared to the conventional circuit. Thus, the response time for restoring the internal source voltage VINT in which a power dip has occurred to the normal reference voltage Vref is further reduced.

Figure 4:
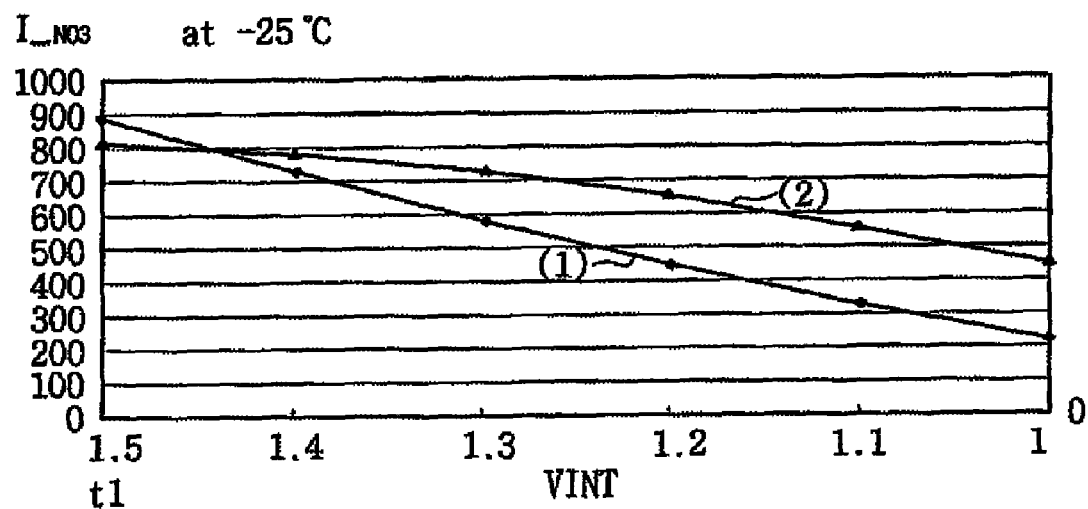
FIG. 4 is a simulation graph illustrating current consumption when a power dip does not occur, in a low-temperature environment, in an internal source voltage generating circuit of a semiconductor memory device according to an example embodiment of the inventive concept.

FIG. 4 is a simulation graph illustrating current consumption immediately before a power dip occurs, in a low-temperature environment, in an internal source voltage generating circuit of a semiconductor memory device according to an example embodiment. In FIG. 4, a curve (1) represents current consumption variation of a driving current generator according to variation of the internal source voltage VINT of a conventional circuit, and a curve (2) represents current consumption variation of the driving current generator 300 according to variation of the internal source voltage VINT according to the example embodiment.

At time t1, when an internal source voltage VINT is 1.5V, which is a reference voltage Vref, immediately before a power dip occurs, an expended current according to the conventional circuit is 870 μA, as can be seen in curve (1). An expended current according to the example embodiment is 800 μA, as can be seen in curve (2).

Current consumption of the driving current generator 300 immediately before the power dip occurs, in a low-temperature environment, in an internal source voltage generating circuit of a semiconductor memory device according to an example embodiment will be described below with reference to FIGS. 1 to 4.

Commonly, in a semiconductor memory device, a threshold voltage Vth of a transistor drops in a high-temperature environment and rises in a low-temperature environment. Referring to FIG. 1, when the semiconductor memory device of the example embodiment is in a low-temperature environment, a threshold voltage Vth of the PMOS transistor P2 rises, the PMOS transistor P2 is turned on weakly, a voltage of the first node NO1 drops, and a threshold voltage Vth of the NMOS transistor N4 rises. Also, the voltage of the first node NO1 drops so that the NMOS transistor N4 is turned on weakly, and a synchronous current flowing from the second node NO2 to the third node NO3 is reduced.

Therefore, as shown in FIG. 4, immediately before the power dip occurs in the low-temperature environment, the current expended in a plurality of current limiters which are connected in parallel in the driving current generator 300 is reduced from 870 μA to 800 μA. Thus, current consumption can be reduced during normal operation in which a power dip does not occur at the internal source voltage node.

At this time, the NMOS transistor N3 operates by a synchronous current as a common source of the NMOS transistors N1 and N2 in the comparison voltage generator 100. A gate of the NMOS transistor N3 is connected to the constant reference voltage Vref. Since the voltage between a gate and a source is constant, it is not sensitive to temperature variation, and since a current driving ability is not variable, dependence on variation of an external source voltage is reduced.

As described above, the internal source voltage generating circuit of the semiconductor memory device according to the example embodiment can rapidly restore the internal source voltage VINT without separately detecting voltages of peripheral circuits when a power dip occurs due to operation of peripheral internal circuits which receive the internal source voltage VINT in a high-temperature environment. It can also reduce current consumption during normal operation in which a power dip does not occur in a low-temperature environment, regardless of variation of an external source voltage.

As can be seen from the foregoing, an internal source voltage generating circuit of a semiconductor memory device according to example embodiments of the inventive concept is not sensitive to variation of an external source voltage, exhibits improved response time when an internal source voltage abruptly drops, and can stably generate an internal source voltage since current is reduced at low temperature.

The foregoing is illustrative of example embodiments of the inventive concept and is not to be construed as limiting thereof. Although a few example embodiments of the inventive concept have been described, those skilled in the art will readily appreciate that many modifications are possible without materially departing from the novel teachings and advantages. Accordingly, all such modifications are intended to be included within the scope of the claims. In the claims, means-plus-function clauses are intended to cover the structures described herein as performing the recited function, and not only structural equivalents but also equivalent structures. Therefore, it is to be understood that the foregoing is illustrative of various example embodiments and is not to be construed as limited to the specific embodiments disclosed, and that modifications to the disclosed embodiments, as well as other embodiments, are intended to be included within the scope of the appended claims.

What is claimed is:

1. An internal source voltage generating circuit of a semiconductor memory device, comprising:
    a comparison voltage generator which receives a reference voltage and an internal source voltage, outputs to a second node a comparison voltage which is differentially amplified in response to a voltage of a first node determined according to a difference between the reference voltage and the internal source voltage, and allows a driving current to flow from a third node to a fourth node;
    an internal voltage driver which transfers an external source voltage to an output node in response to the differentially amplified comparison voltage and outputs the internal source voltage; and
    a driving current generator which increases the driving current flowing from the third node to the fourth node in response to the voltage of the first node which rises when the internal source voltage abruptly drops.

2. The internal source voltage generating circuit of claim 1, wherein the comparison voltage generator comprises:
    a first PMOS transistor and a first NMOS transistor which are serially connected between the external source voltage and the third node, and which have gates connected to the first node and the reference voltage, respectively;
    a second PMOS transistor and a second NMOS transistor which are serially connected between the external source voltage and the third node, and which have gates connected to the first node and the internal source voltage, respectively; and
    a third NMOS transistor which is connected between the third node and the fourth node, and which has a gate connected to the reference voltage,
    wherein a contact point between the second PMOS transistor and the second NMOS transistor is connected to the first node.

3. The internal source voltage generating circuit of claim 2, wherein the internal voltage driver comprises a third PMOS transistor which is connected to the external source voltage at one side and transfers the external source voltage to the output node at an other side thereof, in response to the differentially amplified comparison voltage applied to a gate of the third PMOS transistor.

4. The internal source voltage generating circuit of claim 3, wherein the driving current generator comprises a fourth NMOS transistor which has one side connected to the third node and an other side connected to the fourth node which is grounded, and which generates the driving current in response to the voltage of the first node applied to a gate of the fourth NMOS transistor.

5. The internal source voltage generating circuit of claim 4, wherein in the comparison voltage generator, when the second NMOS transistor is turned on weakly due to an abrupt drop of the internal source voltage at the output node so that the voltage of the first node rises, the first PMOS transistor is turned on weakly so that the comparison voltage at the second node drops.

6. The internal source voltage generating circuit of claim 5, wherein the internal voltage driver is turned on strongly in response to a drop of the comparison voltage at the second node, so that the internal source voltage at the output node rises and the internal source voltage that is abruptly dropped is restored to a normal voltage.

7. The internal source voltage generating circuit of claim 6, wherein the driving current generator restores the internal source voltage to the normal voltage by increasing the driving current using the voltage of the first node which is automatically raised, without separately detecting voltages of internal circuits connected to the output node.

8. The internal source voltage generating circuit of claim 7, wherein when an abrupt voltage drop occurs in a high-temperature environment, the fourth NMOS transistor is turned on strongly in response to the voltage of the first node which is automatically raised, so that the driving current flowing from the third node to the fourth node increases, and the voltage of the first node drops so that the third PMOS transistor is turned on strongly, and the internal source voltage at the output node rises so that the normal voltage is rapidly restored.

9. The internal source voltage generating circuit of claim 8, wherein immediately before an abrupt voltage drop occurs in a low-temperature environment, a threshold voltage of the second PMOS transistor is raised and the second PMOS transistor is turned on weakly so that a voltage of the third node is decreased, and the fourth NMOS transistor is turned on weakly so that current expended in the driving current generator is reduced.

10. The internal source voltage generating circuit of claim 9, wherein a voltage between a gate and a source of the third NMOS transistor becomes constant in response to the reference voltage applied to the gate of the third NMOS transistor, so that current driving ability is fixed regardless of variation of the external source voltage.

11. An internal source voltage generating circuit of a semiconductor memory device comprising:
- a comparison voltage generator coupled to a reference voltage and an internal source voltage that provides a comparison voltage at a second node, the comparison voltage generator including
  - a first PMOS transistor and a first NMOS transistor serially connected between an external source voltage and a third node, a gate of the first PMOS transistor and a gate of the first NMOS transistor respectively connected to a first node and the reference voltage,
  - a second PMOS transistor and a second NMOS transistor serially connected between the external source voltage and the third node, a gate of the second PMOS transistor and a gate of the second NMOS transistor respectively connected to the first node and the internal source voltage, and
  - a third NMOS transistor connected between the third node and a ground node, and having a gate connected to the reference voltage,
  - the second node is a connection point between the first PMOS transistor and the first NMOS transistor;
- an internal voltage driver including a third PMOS transistor connected between the external source and an output node, and having a gate connected to the second node, the internal voltage driver providing the internal source voltage at the output node responsive to the comparison voltage; and
- a driver current generator including a fourth NMOS transistor connected between the third node and the ground node, and having a gate connected to the first node and to a connection point between the second PMOS transistor and the second NMOS transistor.

12. A semiconductor memory device comprising:
- a comparison voltage generator coupled to a reference voltage and an internal source voltage that provides a comparison voltage at a second node, the comparison voltage generator including
  - a first PMOS transistor and a first NMOS transistor serially connected between an external source voltage and a third node, a gate of the first PMOS transistor and a gate of the first NMOS transistor respectively connected to a first node and the reference voltage,
  - a second PMOS transistor and a second NMOS transistor serially connected between the external source voltage and the third node, a gate of the second PMOS transistor and a gate of the second NMOS transistor respectively connected to the first node and the internal source voltage, and
  - a third NMOS transistor connected between the third node and a ground node, and having a gate connected to the reference voltage,
  - the second node is a connection point between the first PMOS transistor and the first NMOS transistor;
- an internal voltage driver including a third PMOS transistor connected between the external source and an output node, and having a gate connected to the second node, the internal voltage driver providing the internal source voltage at the output node responsive to the comparison voltage;
- a driving current generator including a fourth NMOS transistor connected between the third node and the ground node, and having a gate connected to the first node and to a connection point between the second PMOS transistor and the second NMOS transistor; and
- an internal circuit coupled to the output node, that provides operating voltages to the semiconductor device responsive to the internal source voltage.

13. The semiconductor memory device of claim 12, wherein the internal circuit comprises:
- a first voltage generator that provides a substrate voltage for the semiconductor memory device responsive to a substrate voltage enable signal; and
- a second voltage generator that provides a boosted voltage for the semiconductor device responsive to a boosted voltage enable signal.

* * * * *